(12) United States Patent
Harju et al.

(10) Patent No.: US 6,429,752 B1
(45) Date of Patent: Aug. 6, 2002

(54) ELECTRICAL TRANSMISSION LINE ARRANGEMENT HAVING DISPLACED CONDUCTOR SECTIONS

(75) Inventors: Thomas Harju, Sävedalen; Thomas Emanuelsson, Västra Frölunda, both of (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 66 days.

(21) Appl. No.: 09/597,990

(22) Filed: Jun. 19, 2000

(30) Foreign Application Priority Data

Jun. 17, 1999 (SE) .............................................. 9902294

(51) Int. Cl.⁷ ................................................. H01P 3/08
(52) U.S. Cl. .......................... 333/33; 333/238; 174/264
(58) Field of Search .......................... 333/33, 238, 246; 174/264

(56) References Cited

U.S. PATENT DOCUMENTS

| | | | | |
|---|---|---|---|---|
| 5,408,053 A | * | 4/1995 | Young | 333/246 X |
| 5,757,252 A | * | 5/1998 | Cho et al. | 333/34 X |
| 6,072,375 A | * | 6/2000 | Adkins et al. | 333/246 X |

FOREIGN PATENT DOCUMENTS

| | | |
|---|---|---|
| EP | 0 525 810 A1 | 2/1993 |
| EP | 0 848 447 A2 | 6/1998 |
| GB | 2272112 A | 5/1994 |
| JP | 9083232 A | 3/1997 |

* cited by examiner

*Primary Examiner*—Benny Lee
(74) *Attorney, Agent, or Firm*—Nixon & Vanderhye P.C.

(57) ABSTRACT

The invention relates to an electrical transmission arrangement comprising a first section of a conductor with a main extension in two planes, and a first section of a ground plane which extends essentially in parallel with the conductor section on the first side of the conductor section and has a main extension in the same two planes as the conductor section. The transmission arrangement also comprises at least one second and one third section of the said conductor, which have their main extensions in the same two planes as the first section of the conductor, the second conductor section being displaced in parallel with respect to the first conductor section, and the third conductor section being displaced in parallel with respect to the second conductor section, and at least one second and one third section of the said ground plane, which have their main extensions in the same two planes as the first section of the ground plane, the second ground plane section being displaced in parallel with respect to the first ground plane section, and the third ground plane section being displaced in parallel with respect to the second ground plane section, the said parallel displacements of conductor sections and ground plane sections being done in a direction which is at right angles to the two planes which define the main extensions of the conductor sections and ground plane sections, each conductor section being electrically connected at least to the closest of the second conductor sections, each ground plane section being electrically connected at least to the closest of the second ground plane sections on the same side of the conductor, and the conductor sections being separated from the ground plane section by a dielectric material.

18 Claims, 4 Drawing Sheets

US 6,429,752 B1

ELECTRICAL TRANSMISSION LINE ARRANGEMENT HAVING DISPLACED CONDUCTOR SECTIONS

TECHNICAL FIELD

The present invention relates to an electrical transmission arrangement for use preferably within the microwave field, in particular a microstrip arrangement or a strip-line arrangement. The invention is primarily intended to be used in a connection where there is need to transfer electrical signals between different layers of a dielectric substrate in a circuit card.

BACKGROUND

In the transmission of electrical signals in the microwave field, especially in circuit cards, it is usual to make use of the microstrip technology or strip-line technology. In microstrip technology, a usually flat conductor is used, separated from an associated ground plane of a dielectric substrate, where the dielectric substrate is frequently the carrier of a circuit card. The ground plane is also usually flat and mainly arranged in parallel with and separate from the conductor at an essentially constant distance. The strip-line technology comprises the same components as the microstrip technology, but with a second ground plane arranged on the opposite side of the conductor, with respect to the first ground plane. The second ground plane should also be arranged mainly in parallel with the conductor, separated from the conductor by the dielectric substrate at an essentially constant distance, preferably at the same distance as the first ground plane.

As can be seen from the above description, the conductor in the arrangements which are constructed in microstrip or strip-line have their main extension in two planes since the conductors are flat. The result is that problems can arise if it is intended to use such arrangements to transmit electrical energy in other directions than the two directions which are defined by the planes of the conductor.

The requirement for transmitting electrical energy in other directions than those which are defined by the planes of the conductor can arise, for example, in circuit cards which are constructed in so-called multilayer technology. As is indicated by the name, the multilayer technology means that conductors and other components are arranged in different layers in a dielectric substrate which forms the carrier for a circuit card. There may also be a requirement for transmitting signals from components or conductors on one of the layers of the circuit card to conductors or components on another one of the layers of the circuit card.

Another example for a case, where there can be a requirement for transmitting signals from a strip-line arrangement or microstrip arrangement in a direction which deviates from the directions which are defined by the planes of the conductor is if one wishes to connect one circuit or one conductor in one layer in the circuit card with a contact which is situated in connection with one of the surfaces of the circuit card.

A conceivable way of connecting two strip-line conductors or microstrip conductors in different layers in a multilayer circuit card is to introduce a connection between the conductors. Such a connection between conductors in two different layers, however, will be affected by power losses which increase with the length of the connection which limits the possibility for using this type of connections. One of the factors which cause the power losses is that a connection which goes in a direction which deviates from the planes which are defined by the conductors will cause mismatching of the impedance of the circuit.

Document GB 2 272 112 A shows an arrangement with connections between different layers of microstrip conductors in a multilayer circuit card. For reasons set forth above, the connection which is shown in this arrangement exhibits limitations with respect to the maximum distance between two conductors which are to be connected.

SUMMARY OF THE INVENTION

The problem which is solved by the present invention is such that, with low power losses and distances which are largely optional, electrical signals can be transferred between conductors and components in different layers in a multilayer circuit card, in particular if the conductors and components which will be connected to one another are constructed in microstrip technology or strip-line technology.

In microstrip applications, this problem is solved with the aid of an electrical transmission arrangement which comprises a first section of a conductor with a main extension in two planes, a first section of a ground plane which extends essentially in parallel with the conductor section on the first side of the conductor section, at a certain distance and has a main extension in the same two planes as the conductor section. The transmission arrangement also comprises at least one second and one third section of the said conductor, which sections have their main extensions in the same two planes as the first section of the conductor, the second conductor section being displaced in parallel with respect to the first conductor section, and the third conductor section being displaced in parallel with respect to the second conductor section.

The transmission arrangement according to the invention also comprises at least one second and one third section of the said ground plane, which sections have their main extensions in the same two planes as the first section of the ground plane, the second ground plane section being displaced in parallel with respect to the first ground plane section, and the third ground plane section being displaced in parallel with respect to the second ground plane section The parallel displacements of conductor sections and ground plane sections are done in a direction which is at right angles to the two planes which define the main extensions of the conductor sections and ground plane sections, each conductor section being electrically connected at least to the closest of the second conductor sections, each ground plane section being electrically connected at least to the closest of the second first plane sections. The conductor sections being separated from the ground plane sections by a dielectric material.

The connection between two adjacent conductor sections is suitably situated in connection with the edges of the two conductor sections which are closest to one another.

In a particularly preferred embodiment of the invention, the conductor sections are also progressively displaced with respect to one another in a direction which coincides with one of the two planes which define the main extensions of the conductor sections, and the ground plane sections are also progressively displaced with respect to one another in one direction which coincides with one of the two planes which define the main extensions of the ground plane sections.

To facilitate the construction of a transmission arrangement according to the invention, two adjacent ground plane sections can be given different lengths in the direction in which they are progressively displaced with respect to one another, whereby the displacement of the ground plane sections is produced by one part of a ground plane section extending past an adjacent ground plane section.

To minimize the power losses in a transmission arrangement according to the invention, the ground plane sections and conductor sections should be constructed in such a manner that all points on all conductor sections have essentially the same capacitance with respect to the ground plane. This is suitably done by the connection between two adjacent conductor sections passing at least one edge in a ground plane section, which edge is constructed for impedance matching. In a preferred embodiment of the invention, this construction provides at least a part of the edge with an elliptical shape.

If the transmission arrangement according to the invention is to be used in association with a strip-line, one further ground plane section should also be arranged on the other side of at least one of the conductor sections, and this ground plane section is also separated from the conductor section by a dielectric material. The further ground plane section is suitably, but not necessarily, situated at the same distance from the conductor section as the ground plane section which is situated on the first side of the conductor section.

In association with a strip-line, the transmission arrangement can also comprise furthermore at least two ground plane sections situated on the second side of the corresponding conductor section, separated from their corresponding conductor sections by a dielectric. material, whereby the ground plane section on both sides of a conductor section are situated at essentially the same distance from the conductor section, separated from the conductor section by a dielectric material. More generally, each ground plane section on the said second side of a conductor section can quite simply correspond to a ground plane section on the first side of the conductor section, taking into account the rule of equal distances between conductor and ground plane on both sides of the conductor.

As in the embodiments of the invention described earlier, two adjacent ground plane sections on the second side of a conductor section can exhibit different lengths in the direction in which the conductor sections are progressively displaced with respect to one another.

The ground plane sections in the embodiment of the invention which is intended for strip-line applications essentially have the same construction for impedance matching as the ground planes on the first side of the conductor sections, which has been described above.

BRIEF DESCRIPTION OF THE FIGURES

The invention will be described in greater detail below with the aid of examples of embodiments and with reference to the attached drawings, in which.

DETAILED DESCRIPTION OF THE PREFERRED EMBODIMENTS

Figure 1:
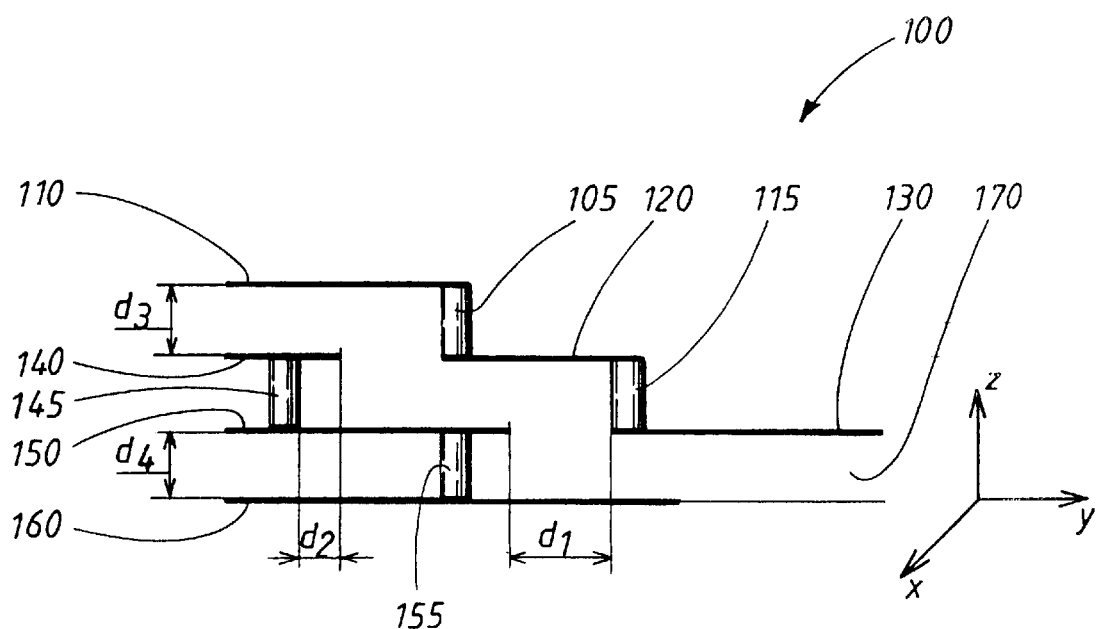
FIG. 1 shows a cross section from one side of a microstrip arrangement according to the invention.

FIG. 1 shows a cross section from the side of a transmission arrangement 100 according to the invention, mainly intended for microstrip applications. To facilitate the understanding of the description of the invention, a three-dimensional orthogonal Cartesian coordinate system (x,y,z) has been drawn in connection with FIG. 1. As can be seen from FIG. 1, the arrangement 100 comprises a first conductor section 110, a second conductor section 120 and a third conductor section 130. All conductor sections are flat and, in other words, have their main extensions in two planes (x,y). As can also be seen from FIG. 1, the conductor sections are situated in different layers in a dielectric substrate 170 and are arranged in such a manner, that the first conductor section 110 is displaced in parallel with respect to the second conductor section 120, and the second conductor section 120 is displaced in parallel with respect to the third conductor section 130.

For the sake of clarity, it can be said that the progressive parallel displacements of the conductor sections occur in a direction (z) which is at right angles to the two planes (x,y) which define the main extensions of the conductor sections.

Apart from the fact that the conductor sections are displaced in parallel with respect to one another in the manner which has been described above, the conductor sections are suitably progressively displaced with respect to one another in another direction which coincides with one of the two planes (y) which direction defines the main extensions of the conductor section. In other words, the second conductor section is displaced in parallel with respect to the first conductor section and is also displaced in that direction (y), which also applies to the third conductor section displaced with respect to the second.

The invention can be extended with an arbitrary number of conductor sections and it should only be considered as an example that the number of conductor sections in the drawing is three. The principle, described above, of how the conductor sections are arranged with respect to one another should be applied throughout the arrangement regardless of the number of conductor sections.

The arrangement 100 also comprises first, second and third ground plane sections 140, 150, and 160, respectively, which are separated from the conductor sections and from one another by the dielectric material 170. Like the conductor sections, the ground plane sections are also essentially flat and have their main extensions in the same two planes (x,y) as the conductor sections 110, 120, 130.

The first ground plane section 140 essentially extends in parallel with the first conductor section 110 on the first side of this conductor section at a certain distance ($d_3$) from the latter, the second ground plane section 150 is displaced in parallel with respect to the first ground plane section 140, and the third ground plane section 160 is likewise displaced in parallel with respect to the second ground plane section 140.

For the sake of clarity, it can be pointed out here, that the parallel displacement of the ground plane sections occurs in the same direction as the parallel displacement of the conductor sections, in other words, a direction (z) which is at right angles to the two planes (x,y) which define the main extensions of the conductor sections and the ground plane sections.

Like the conductor sections, the ground plane sections are suitably also progressively displaced with respect to one another in a direction (y) which coincides with one of the two planes (x,y) which define the main extensions of the ground plane sections. In other words, the second ground plane section is displaced in parallel (z) with respect to the first ground plane section and also displaced in the direction (y), which also applies to the third ground plane section with respect to the second ground plane section.

Displacement of the ground plane sections with respect to one another in a direction (y) which coincides with one of the two planes (x,y) which define the main extensions of the ground plane sections can be suitably done in a way which is shown in FIG. 1, which means that each ground plane section is made longer than one of the closest ground planes, which has a result that the displacement arises by a part of each ground plane extending past the edge of one of the closest ground planes. In other words, in practice, a stepped formation of ground plane sections is formed.

In a variant of the invention which is shown in FIG. 1, the ground plane sections are constructed in such a manner that they only have different lengths in the direction (y) in which they will be progressively displaced with respect to one another.

The invention can be extended with an arbitrary number of ground plane sections and it should only be considered as an example that the number of ground plane sections in FIG. 1 is three. The principle, described above, of how the ground plane sections are arranged with respect to one another should, however, be applied for the arrangement regardless of the number of ground plane sections. However, the arrangement suitably has the same number of ground plane sections as the number of conductor sections in the embodiment which is intended for microstrip applications.

The first ground plane section 140 extends essentially parallel with the first conductor section 110, and since the ground plane sections and conductor sections are mutually displaced in parallel and also progressively displaced in another direction (y), the result is that the second ground plane section 150 will be essentially in parallel with the second conductor section 120, a relationship which also applies to the third ground plane section 160 with respect to the third conductor section 130.

The distance between the second conductor section 120 and the second ground plane section 150 is suitably the same as the distance ($d_3$) between the first conductor section 110 and the first ground plane section 140, which also applies to the distance between the third conductor section 130 and the third ground plane section 160. The principle of equal distances between a conductor section and its closest ground plane section is suitably observed regardless of how many conductor sections and corresponding ground plane sections are included in the arrangement. For the sake of clarity, it can be pointed out here, that the closest ground plane section means the one which is closest in the direction which at right angles to the two planes (x,y) which define the main extensions of the conductor sections and the ground plane sections.

The distance $d_4$ between the second and the third ground plane section is suitably also the same between two adjacent ground plane sections in the whole arrangement.

Every one of the conductor sections 110, 120, 130 is electrically connected to the closest of the other conductor sections and every one of the ground plane sections 110, 120, 130 is electrically connected to the closest of the other ground plane sections. The connections 105, 115 between the conductor sections and the connections 145, 155 between the ground plane sections are suitably constructed of so-called through-holes, in other words holes which are made in the dielectric material 170 which separates the conductor sections and, respectively, ground plane sections from one another, after which the holes are metallized completely or partially which makes the through-holes electrically conducting. The more detailed construction and placing of the connections between the ground planes and between the conductor sections will be described in detail below in connection with FIGS. 2, 3 and 5.

Figure 2:
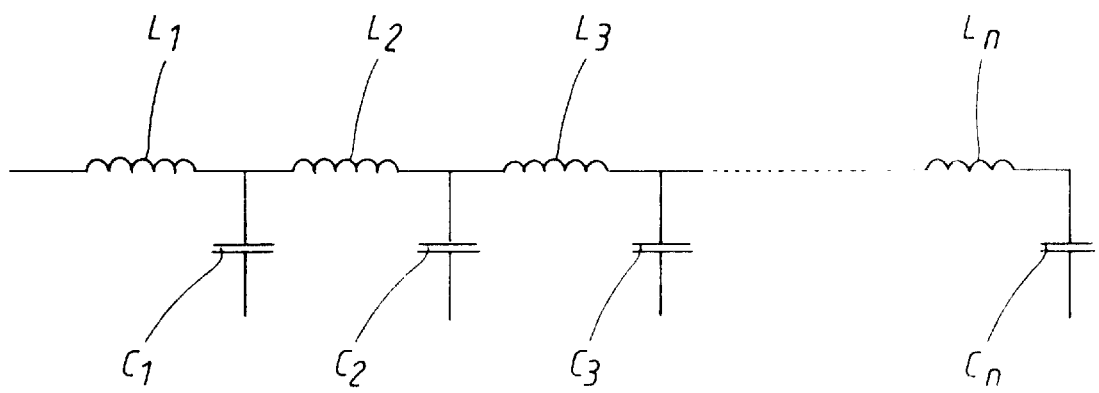
FIG. 2 shows an equivalent circuit diagram for an arrangement according to the invention.

FIG. 2 shows an equivalent circuit diagram for a microstrip arrangement or strip-line arrangement. As can be seen from FIG. 2, the equivalent circuit diagram is made up of a number of inductances $L_1$, $L_2$, $L_3$, ... $L_n$ and a corresponding number of capacitances, $C_1$, $C_2$, $C_3$, ... $C_n$. The magnitude of the inductances and capacitances in a conventional microstrip arrangement or strip-line arrangement depends to a large extent on the distance/distances between the conductors and the ground planes of the arrangement, and on the width of the conductors and the ground planes. A conventional microstrip arrangement or strip-line arrangement is thus constructed to provide a certain required impedance.

It is desirable, that an arrangement according to the invention provides the lowest possible power losses, with the result, that the arrangement should be constructed in such a manner that it exhibits the same impedance as the surrounding microstrip arrangement or strip-line arrangement in which it will be used. To obtain this result, the ground plane sections and conductor sections in the arrangement should be constructed in such a manner that all points on all conductor sections exhibit essentially the same capacitance with respect to the ground plane. This impedance matching of the arrangement according to the invention is produced not only by influencing the width of the conductors and the ground planes and the distance between the conductors and the ground planes, but also by the construction of the connections 145, 155 between the different ground plane sections and of the connections between the different conductor sections 105, 115 which will be described below.

Figure 3:
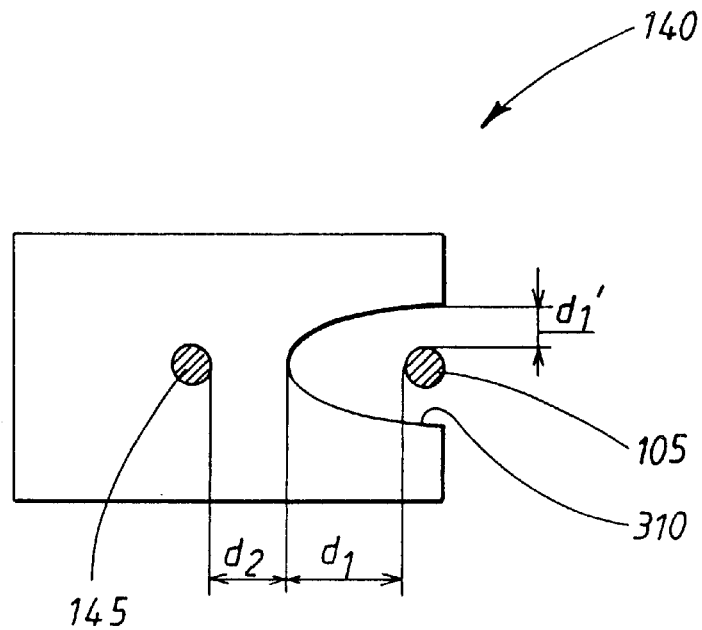
FIG. 3 shows a ground plane according to the invention, seen from above.

FIG. 3 shows an example of how a ground plane section for use in an arrangement according to the invention can be constructed, for example the ground plane section 140. However, the principles which will be described for the construction of the ground plane section 140 also apply to all ground plane sections in an arrangement according to the invention intended for microstrip applications.

The ground plane section 140 is shown "from above" in FIG. 3, in other words, from the direction (z) in which the different conductor sections and ground plane sections are displaced in parallel with respect to one another. The drawing also shows the connection 145 between the ground plane 140 and "next" ground plane 150, and the connection 105 between the first conductor section 110 and the second conductor section 120 of FIG. 1. The principles which will be described here for how the connections between two conductor sections are placed with respect to a ground plane section are also generally applicable for an arrangement according to the invention intended for microstrip applications.

As can be seen from FIG. 1 and FIG. 3, the connection 105 between the two conductor sections 110 and 120 passes an edge 310 (see FIG. 3) in the first ground plane section 140. Since the impedance of the arrangement 100 is affected by the distance between the conductor sections and the ground planes, the edge 310 of the ground plane section and the distance between the edge 310 and the connection 105 between two conductor sections should be constructed in such a manner, that the total capacitance between the edge 310 and the connection 105 is spread as uniformly as possible. An advantageous way of achieving this is to construct a part of the edge 310 as a part of an imagined ellipse, the connection 105 being placed essentially in the center point of the imagined ellipse as shown in FIG. 3.

FIG. 3 also shows the connection 145 which connects the first ground plane 140 with the second ground plane section 150. To achieve the required impedance matching in an arrangement according to the invention, the distance $d_2$ between the connection, through-hole 145 and the edge 310 on the ground plane section which the connection between two conductor sections passes should be of such magnitude, that the capacitance coupling between the conductor connection 105 and the edges of the parts of the ground plane section 140 which are closest to the connection 145, which parts are made up of the edges of the ellipse in the present case, dominates over the capacitance coupling which is produced between the ground plane connection 145 and the conductor connection 105.

Figure 4:
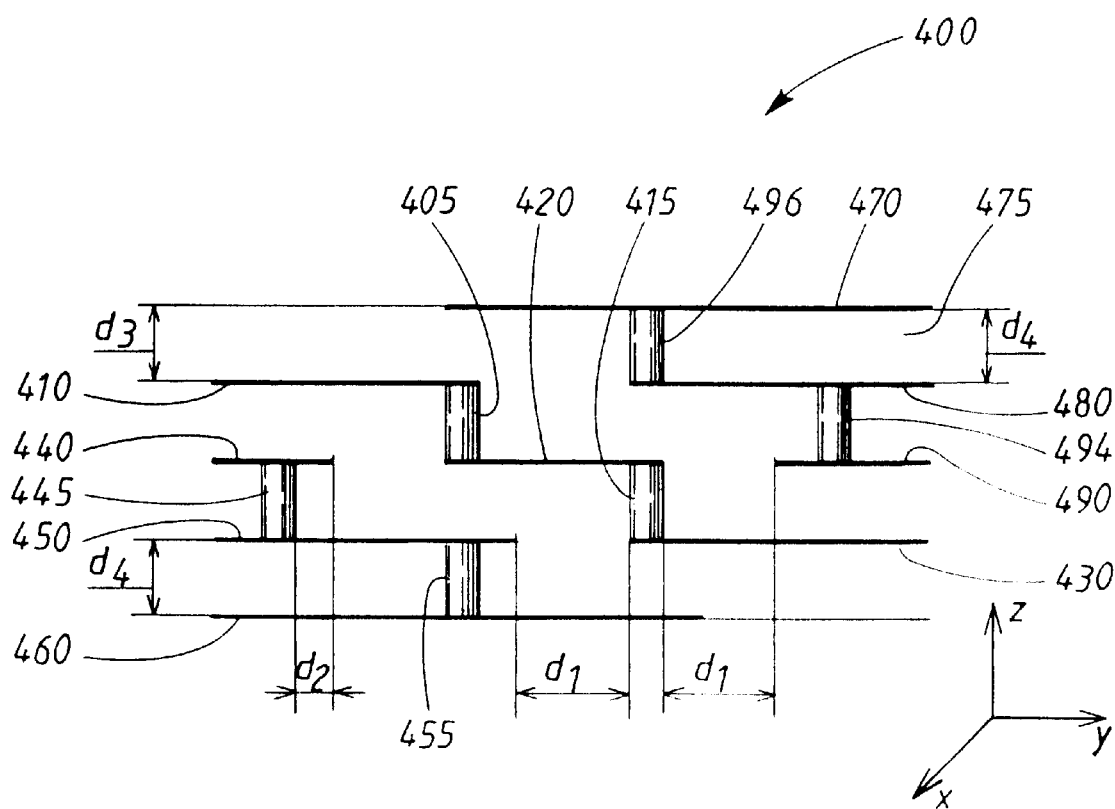
FIG. 4 shows a cross section from one side of a strip-line arrangement according to the invention.

FIG. 4 shows a cross section from the side of an arrangement 400 according to the invention, intended for strip-line applications. The conductor sections in arrangement 400 in FIG. 4 correspond to the conductor sections in the variant 100 of the arrangement which is intended for microstrip applications, but since the strip-line technology comprises a conductor with two ground planes, one on each side of the conductor, the arrangement 400 according to the invention should comprise at least another ground plane section 470 situated on the other side of one of the conductor sections 410. The ground plane section 470 cooperates with the closest ground plane section 440 on the first side of the conductor section to form an arrangement according to the strip-line principle. The second ground plane section 470 is suitably situated at the same distance $d_3$ from the second side of the conductor section 410 as the ground plane section 440 on the first side of the conductor section 410, with which it is cooperating.

In a preferred embodiment, an arrangement according to the invention, which will be used in strip-line applications, comprises ground plane sections on one first and one second side of all conductor sections in the arrangement. For the arrangement shown in FIG. 4, this means that the arrangement 400 on the second side of the conductor section 410, 420, 430, apart from the above mentioned further ground plane sections 470, also comprises two further ground plane sections 480, 490, situated on this second side of the conductor section. These two further ground plane sections 480, 490 are also situated at the same distance $d_3$ from their respective conductor sections 420, 430 as the ground plane sections 450, 460 on the first side of the conductor sections with which the ground plane sections on the second side is cooperating. This principle of equal distances between cooperating ground plane sections on both sides of the conductor sections should be taken into consideration regardless of how many conductor sections and ground plane sections a strip-line arrangement according to the invention is provided with.

Every one of the ground plane sections 470, 480, 490 on the second side of the conductor sections in the variant of the invention which is intended for strip-line applications also corresponds to a ground plane section on the first side of the conductor section with regard to dimensioning, construction etc., in all essential respects. To facilitate the understanding of this principle, the following can be pointed out with reference to FIG. 4: The ground plane sections 470 and 440 together form a ground plane according to the strip-line principle for a part of the conductor section 410. However, it is the ground plane section 470 on the second side of the conductor sections with respect to construction and dimensioning which corresponds to the ground plane section 460 on the first side, since these two ground plane sections are those which are located "outermost" in the arrangement. This principle with respect to correspondence between two ground plane sections on both sides of the conductor sections should apply to all ground plane sections in an arrangement intended for strip-line applications.

Certainly, the ground plane sections 470, 480, 490 on the second side of the conductor sections are also separated from their corresponding conductor sections by a dielectric material 475 and, like the ground plane sections on the first side, each ground plane section on the second side is connected to the closest one of the second ground plane sections.

With the principles, described above, for placing and dimensioning the ground plane sections, the following can finally be described with respect to an arrangement according to the invention which is intended to be applied in association with strip-lines: The ground plane sections 470, 480, 490 on the said second side of the conductor sections are, like the ground plane sections on the first side of the conductor sections, progressively displaced with respect to one another in a direction (y) which coincides with one of the two planes (x, y) which define the main extensions of the ground plane sections. This displacement is suitably carried out in the same way as the displacement in the same direction of the ground plane sections on the first side of the conductor sections each ground plane section is made longer than one of the closest ground planes which has a result that the displacements are produced by a part of each ground plane extending past the edge on one of the closest ground planes. In other words, in practice, a stepped formation of ground plane sections is formed.

In the variant of the invention which is shown in FIG. 4, the ground plane sections are constructed in such a manner that they only have different lengths in the direction (y) in which they will be progressively displaced with respect to one another. With respect to this difference in length, the ground plane sections 470, 480, 490 on the second side of the conductor sections can also suitably be given the same lengths as a corresponding ground plane section 460, 450, 430 on the first side.

In the variant of the invention which is intended for strip-line applications, each conductor section is also connected with one or more of the other conductor sections, suitably the closest ones, in the same way as has been described above in connection with FIG. 1. As can be seen from FIG. 4, the connections between two adjacent conductor sections pass at least one edge in a ground plane section on the said second side of a conductor section, which is why these edges should be constructed for impedance matching of the transmission arrangement.

The construction of the ground plane section which has been shown above in connection with a microstrip variant of the invention can be advantageously also applied to the variant of the invention which is intended to be used in association with strip-lines. The result is that the ground plane section which is shown in FIG. 3 and which has been described above can also be applied in association with strip-lines. The description of the ground plane section 140 in FIG. 3 will not, therefore, be repeated here.

As can be seen from FIG. 4, at least one ground plane section 440 on the first side of the conductor sections will end up at the same "level" in the dielectric substrate 475 as one of the ground plane sections 490 on the second side in the arrangement 400. The result is that the two ground planes 440, 490, which are located at the same level, instead of being constructed as two separate sections with the appearance of section 140 in FIG. 3, can be constructed as a coherent, preferably symmetric, disc with a recess in the center through which recess the connection between two conductor sections goes.

Figure 5:
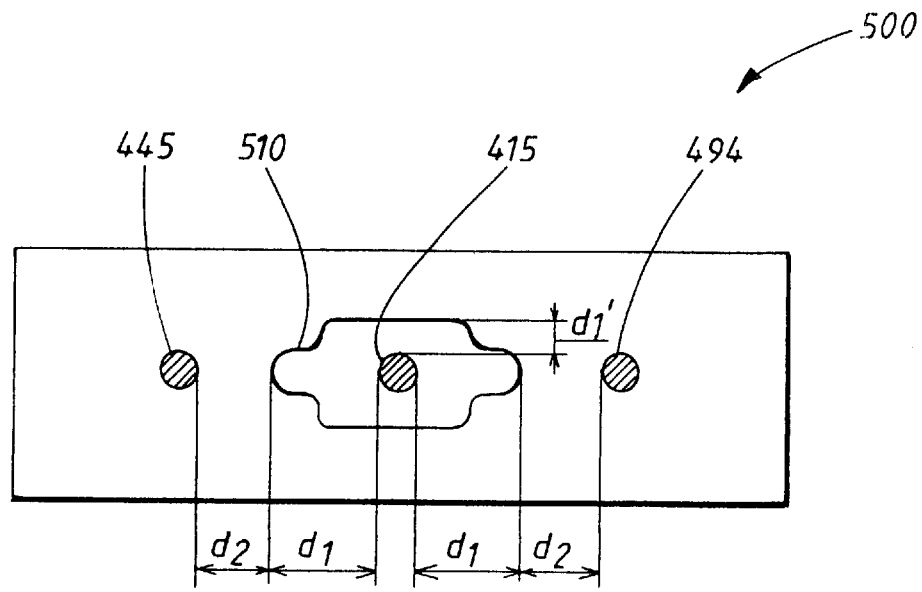
FIG. 5 shows an alternative ground plane according to the invention, seen from above.

Such a coherent disc 500 for use as ground plane section in a transmission arrangement 400 according to the invention is shown in FIG. 5. FIG. 5 shows the recess in the disc, the connection 415 between two conductor sections 420, 430 (see FIG. 4) which go through the recess in the disc, and two connections 445, 494, which connect the disc with the two closest ground plane sections 450, 480 (see FIG. 4).

As can be seen from FIG. 5, the elliptical shape of the edge 510 is retained at the recess which is closest to the connections 445, 494 to the second ground plane. The distance d2 between the ground plane connections 445, 494 and the edge are preferably the same and are suitably selected according to the principles which have been described for corresponding connections in association with FIG. 3.

The connection 415 between two conductor sections are suitably placed in the center of the recess in the disc 500 which, due to the shape of the recess, has the result that the connection 415 will have a largest distance $d_1$ and a smallest distance $d_1'$ to the edge 510 of the recess.

Figure 6A:
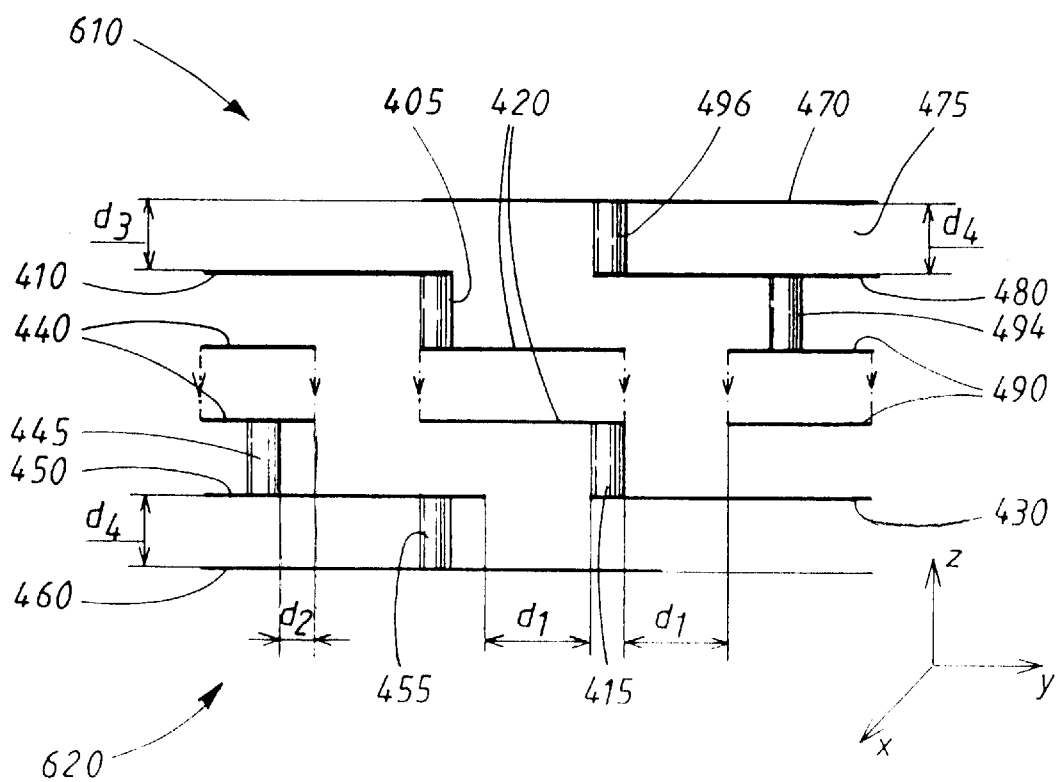
FIGS. 6a and 6b show an application of the invention.
Figure 6B:
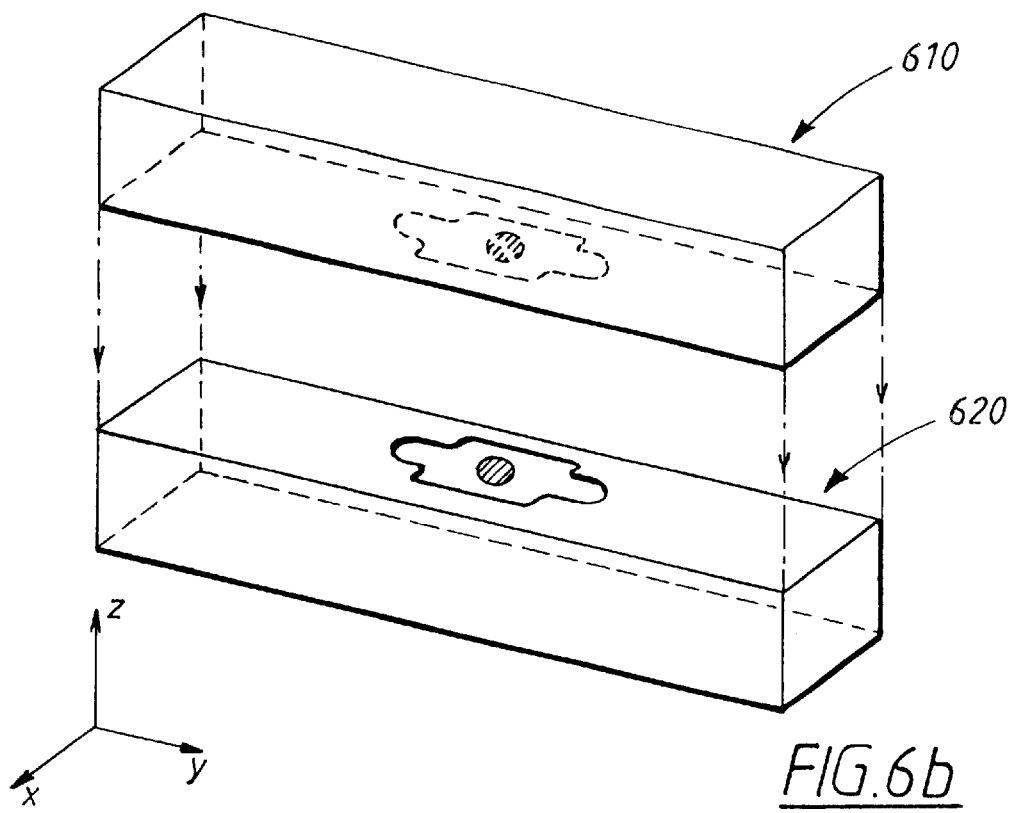

If a high-frequency signal is transferred between two transmission arrangements in different substrates which will be mounted together, a plate of the type 500 can be preferably used in both transmission arrangements. The two transmission arrangements suitably have such a plate 500 as termination towards the surface on the substrate which will be joined with the second substrate. This is shown diagrammatically in FIGS. 6a and 6b with the same number designations as in FIGS. 4 and 5.

Figure 7:
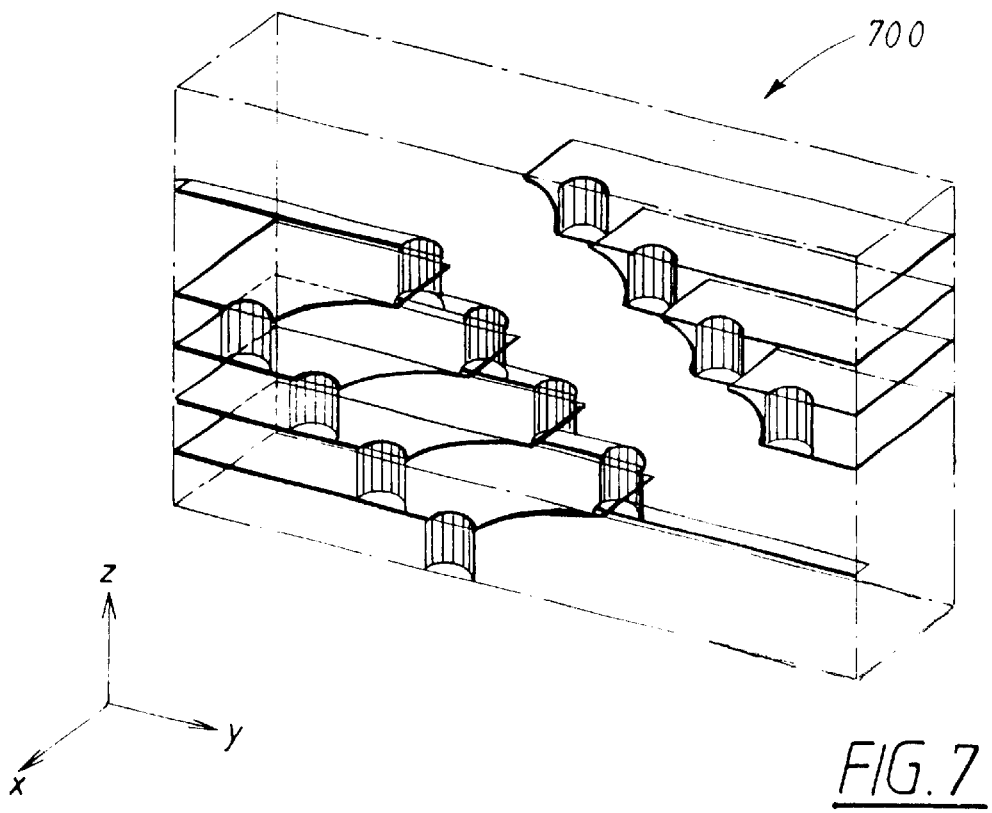
FIG. 7 shows a cross section in perspective of a strip-line arrangement according to the invention.

FIG. 7 shows a cross section in perspective of an arrangement 700 according to the invention, intended for strip-line applications. FIG. 7 shows the stepped construction which the ground plane sections have on both sides of the conductor sections. Furthermore, FIG. 7 shows the connections between different ground plane sections and the connections between different conductor sections.

The invention is not limited to the above embodiments, but can be freely varied within the scope of the patent claims following.

What is claimed is:

1. An electrical transmission line arrangement comprising:
   a first section of a conductor with a main extension in two planes;
   a first section of a ground plane extending essentially in parallel with and separated from the first conductor section on a first side of the first conductor section and separated from the first conductor section by a certain distance and having a main extension in the same two planes as the first conductor section,
   a second conductor section and a third conductor section each having main extensions in the same two planes as the first conductor section, the second conductor section being displaced in parallel with respect to the first conductor section, and the third conductor section being displaced in parallel with respect to the second conductor section; and
   a second ground plane section and a third ground plane section each having main extensions in the same two planes as the first ground plane section, the second ground plane section being displaced in parallel with respect to the first ground plane section, and the third ground plane section being displaced in parallel with respect to the second ground plane section,
   wherein the parallel displacements of the second and third conductor sections and the second and third ground plane sections are in a direction which is at right angles to the two planes which define the main extensions of the first, second, and third conductor sections and the first, second, and third ground plane sections, each of the first, second, and third conductor sections being electrically coupled to a closest of the other two conductor sections, each of the first, second, and third ground plane sections being electrically coupled to a closest of the other two ground plane sections, and each of the first, second, and third conductor sections being separated from a corresponding one of the first, second, and third ground plane sections by a dielectric material.

2. A transmission line arrangement according to claim 1, in which the first, second, and third conductor sections are also progressively displaced with respect to one another in a direction which coincides with one of the two planes which define the main extensions of the first, second, and third conductor sections.

3. A transmission line arrangement according to claim 2, in which the connection between two adjacent ones of the first, second, and third conductor sections is situated adjacent to edges of the two ones of the first, second, and third conductor sections which are closest to one another.

4. A transmission line arrangement according to claim 1, in which the first, second, and third ground plane sections are progressively displaced with respect to one another in a direction which coincides with one of the two planes which define the main extensions of the first, second, and third ground plane sections.

5. A transmission line arrangement according to claim 4, in which two adjacent ones of the first, second, and third ground plane sections exhibit different lengths in the direction in which the two ground plane sections are progressively displaced with respect to one another.

6. A transmission line arrangement according to claim 1, in which the first, second, and third ground plane sections and the first, second, and third conductor sections are constructed in such a manner that all points on all of the first, second, and third conductor sections exhibit essentially the same capacitance with respect to the corresponding first, second, and third ground plane sections.

7. A transmission line arrangement according to claim 1, in which the connection between two adjacent ones of the first, second, and third conductor sections passes at least one edge in one of the first, second, and third ground plane sections, the at least one edge being designed for impedance matching.

8. A transmission line arrangement according to claim 7, in which said design provides at least a part of the at least one edge with an elliptical form.

9. A transmission line arrangement according to claim 1, in which the distance between one of the first, second, and third conductor sections and a closest one of the first, second, and third ground plane sections is essentially the same for all of the first, second, and third conductor sections, with the closest ground plane section being closest in the direction at right angles to the two planes which define the main extensions of the first, second, and third conductor sections and the first, second, and third ground plane sections.

10. A transmission, line arrangement according to claim 1, in which the distance between two adjacent ones of the first, second, and third ground plane sections is essentially the same for all of the first, second, and third ground plane sections.

11. A transmission line arrangement according to claim 1, which also exhibits on a second side of at least one of the first, second, and third conductor sections one further ground plane section which is separated from the at least one conductor section by the dielectric material.

12. A transmission line arrangement according to claim 11, in which the further ground plane section is situated at the same distance from one of the first, second, and third conductor sections as the first ground plane section which is situated on the first side of the first conductor section.

13. A transmission line arrangement according to claim 12, which also comprises at least two further ground plane sections situated on said second side of corresponding ones of the first, second, and third conductor sections, and separated therefrom by the dielectric material, each one of the further ground plane sections being connected to another, closest one of the ground plane sections.

14. A transmission line arrangement according to claim 13, in which each of the further ground plane sections on said second side of one of the first, second, and third conductor sections cooperates with a corresponding one of the ground plane sections on said first side of the one conductor section to form a ground plane according to the strip-line principle, with the cooperating ground plane sections being situated at essentially the same distance from the corresponding conductor section and separated from the corresponding conductor section by the dielectric material.

15. A transmission line arrangement according to claim 14, in which the further ground plane sections on said second side of one of the first, second, and third conductor sections are also progressively displaced with respect to one another in a direction which coincides with one of the two planes which define the main extensions of the first, second, and third ground plane sections.

16. A transmission line arrangement according to claim 15, in which two adjacent ones of the first, second, and third ground plane sections on said second side exhibit different lengths in the direction in which the first, second, and third conductor sections are progressively displaced with respect to one another.

17. A transmission line arrangement according to claim 16, in which the connection between two adjacent ones of the first, second, and third conductor sections passes at least one edge in one of the ground plane sections on said second side, the at least one edge being designed for impedance matching.

18. A transmission line arrangement according to claim 17, in which said design provides at least a part of the edge with an elliptical form.

* * * * *